US006448192B1

(12) United States Patent
Kaushik

(10) Patent No.: US 6,448,192 B1
(45) Date of Patent: Sep. 10, 2002

(54) METHOD FOR FORMING A HIGH DIELECTRIC CONSTANT MATERIAL

(75) Inventor: Vidya S. Kaushik, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/835,770

(22) Filed: Apr. 16, 2001

(51) Int. Cl.$^7$ .............................................. H01L 21/31
(52) U.S. Cl. ...................... 438/785; 438/761; 438/762; 438/765; 438/770; 438/778; 438/779; 438/787
(58) Field of Search ................................ 438/785, 287, 438/591, 761, 762, 765, 770, 778, 779, 787

(56) References Cited

U.S. PATENT DOCUMENTS

| | | | |
|---|---|---|---|
| 5,969,276 A | 10/1999 | Lindberg | 75/246 |
| 5,990,820 A | 11/1999 | Tan | 341/161 |
| 6,271,094 B1 * | 8/2001 | Boyd et al. | 438/287 |

OTHER PUBLICATIONS

Jerzy Ruzyllo et al., "Cleaning Technology in Semiconductor Device Manufacturing," Electrochemical Society Proceedings, vol. 92–12, pp. 372–409.

Kozo Mochiji et al., "Atomic–Layer Etching of a Br–Saturated Si(111)–7×7 Surface by Using Scanning Tunneling Microscope," Japanese Journal of Applied Physics, Part 2, Letters, Jan. 15, 1999, vol.38, No. 1 A/B, Serial No. 295, pp. L1–L3.

Takayuki Sugiyama, "A Study on Atomic–Layer Etching of Group IV Semiconductors," 2 pp., Jan./1998.

K. Eberl et al., "Atomic layer in situ etching and MBE regrowth," Journal of Crystal Growth 201/202, 1999 Elsevier Science B.V., pp. 568–573.

T. Matsuura et al., "Atomic–layer surface reaction of chlorine on Si and Ge assisted by an ultraclean ECR plasma," Surface Science 1998 Elsevier Science B.V., pp. 402–404.

T. Iimori et al., "Laser–induced mono–atomic–layer etching on Cl–adsorbed Si(lll) surfaces," 1998 Elsevier Science B.V., Applied Surface Science, pp. 130–132.

Nawoyuki A. Kubota et al., "Molecular dynamics simulations of low–energy (25–200 eV) argon ion interactions with silicon surfaces: Sputter yields and product formation pathways," 1998 Journal of Applied Physics vol. 83 No. 8, pp. 4055–4063.

K. Eberl et al., "Self–Assembling nanostructures and atomic layer precise etching in molecular beam epitaxy," Solid State Ionic, 2000 Elsevier Science B.V., pp. 61–68.

* cited by examiner

Primary Examiner—Matthew Smith
Assistant Examiner—V. Yevsikov
(74) Attorney, Agent, or Firm—Kim-Marie Vo; James L. Clingan, Jr.

(57) ABSTRACT

Highe quality silicon oxide having a plurality of monolayers is grown at a high temperature on a silicon substrate. A monolayer of silicon oxide is a single layer of silicon atoms and two oxygen atoms per silicon atom bonded thereto. The silicon oxide is etched one monolayer at a time until a desired thickness of the silicon layer is obtained. Each monolayer is removed by introducing a first gas to form a reaction layer on the silicon oxide. The gas is then purged. Then the reaction layer is activated by either another gas or heat. The reaction layer then acts to remove a single monolayer. This process is repeated until a desired amount of silicon oxide layer remains. Because this removal process is limited to removing one monolayer at a time, the removal of silicon oxide is well controlled. This allows for a precise amount of silicon oxide to remain.

37 Claims, 1 Drawing Sheet

METHOD FOR FORMING A HIGH DIELECTRIC CONSTANT MATERIAL

FIELD OF THE INVENTION

The field of this invention is semiconductor devices and, more particularly, is the formation of high dielectric constant materials.

BACKGROUND OF INVENTION

As semiconductor structures shrink, the scaling of the gate dielectric is necessary. Traditionally the gate dielectric consists of $SiO_2$. $SiO_2$, however, will not suffice for the dimensions needed for future technology. Alternately, high dielectric constant (high K) materials are being pursued as replacements for $SiO_2$. During the processing of high K materials, interfacial $SiO_2$ formed on the Si substrate is difficult to prevent or remove. This $SiO_2$ interfacial layer is typically around 10 to 15 Angstroms in thickness. A thinner layer of $SiO_2$ such as 7 Angstroms is desirable in order to provide a good Si—$SiO_2$ interface with minimal interfacial states. One way to decrease the thickness of the $SiO_2$ layer is to lower the temperature of the oxygen flow rate during formation of the high K material. This results, however, in an oxygen deficient or "leaky" film. An $O_2$ anneal is therefore needed to decrease the leakage of the high K material, but the $O_2$ anneal will cause the $SiO_2$ layer to increase in thickness. In addition, the processing at low temperature increases non-uniformity of the $SiO_2$ layer and results in a poor quality high K material. Therefore, a need in the industry exists for a process for forming a high K material with a thin, high quality $SiO_2$ layer.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Embodiments of the present invention intentionally grow a high quality $SiO_2$ layer, which forms a good interface between the silicon substrate and the $SiO_2$ dielectric with appropriate interfacial state density. Afterwards, the $SiO_2$ material is etched one monolayer at a time using layer by layer etching, also known as atomic layer etching (ALE). The desired high K material is formed above the thinned $SiO_2$ dielectric layer. The present invention can be incorporated into a traditional transistor. The invention is better understood by turning to the figures.

Figure 1:
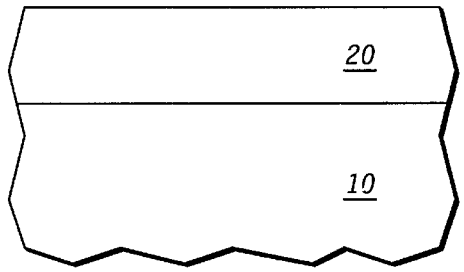
FIG. 1 illustrates a cross sectional view of high quality silicon oxide on a portion of a substrate as known in the prior art.

FIG. 1 shows dielectric material 20 over substrate 10. Typically, the substrate is a silicon monocrystalline material. The substrate could also be silicon on insulator (SOI), gallium arsenide, germanium, silicon germanium or the like. In a preferable embodiment, dielectric material 20 is SiO2. In an alternate embodiment, the SiO2 is doped with an impurity, such as nitrogen. Dielectric material 20 is formed on substrate 10 using methods that are well known in the field. Typically, a thermal growth process is used with a high temperature range between approximately 800 and 1000 degrees Celsius. More specifically, the temperature is greater than about 850 degrees Celsius. For the present invention, the thickness of the $SiO_2$ material is approximately 15–30 Angstroms. The thickness must be large enough to grow a high quality $SiO_2$ layer. However, the maximum thickness of the $SiO_2$ layer is limited by the time constraints of the subsequent monolayer etching of dielectric material 20. In a preferred embodiment, dielectric material 20 is approximately 18 Angstroms. This equates to approximately five monolayers of $SiO_2$. A monolayer of $SiO_2$ is a layer of molecules, wherein each molecule consists of one silicon atom and two corresponding oxygen atoms.

Figure 2:
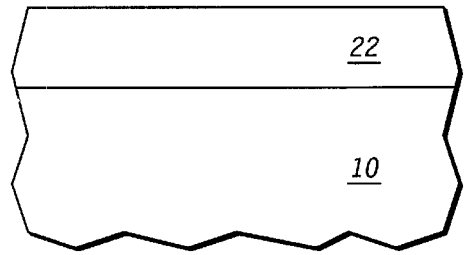
FIGS. 2–4 illustrate a cross sectional view of a portion of a substrate during and after atomic layer etching of the $SiO_2$ layer as taught in the present invention.

FIG. 2 illustrates the layer by layer etching of a first monolayer of $SiO_2$ In a reaction chamber, a gas is flowed which will bond with the oxygen atoms of dielectric monolayer 20 and form a first reaction layer. The gas chosen must have the properties that it will readily attach to the oxygen atoms of the $SiO_2$ monolayer and react with the oxygen atom of $SiO_2$ in response to a stimulus whereby recreating a byproduct that contains silicon. Some such gases include $CHF_3$ and $CF_4$. This reaction will occur at a temperature less than approximately 200 degrees Celsius. The temperature is controlled by using a lamp or rapid thermal anneal. Generally, a pressure will be chosen between about 1 and 15 mTorr. The flow rate of the gases chosen is not critical to the etching of the monolayer because the process is limited by the adsorption of the gas onto the surface of dielectric material 20. Next, a purge process is performed to remove any excess gas molecules which are not adsorbed on the surface of dielectric material 20. Purge parameters that are typically used in atomic layer deposition (ALD) can be used. During purging, a non-reactive gas such as, nitrogen or argon is flowed at approximately 50–100 sccm for about 0.5–1 seconds within the reaction chamber.

A second gas is introduced to cause the first gas to react with the $SiO_2$. In one embodiment, the second gas is $O_2$. In another embodiment, if $CHF_3$ is the first gas, the second gas is $CF_4$. The reaction causes silicon atoms to dissociate from the oxygen atoms and create a byproduct with the atoms from the first gas. The oxygen atoms that were bound to the silicon will form molecules with atoms from the first gas. In addition, a byproduct created from atoms of the first gas and second gas will exist. The process occurs at a temperature less than approximately 200 degrees Celsius. The temperature may be different than the temperature during introduction of the first gas. To remove the three created molecules, another purge process using a non-reactive gas is performed. In one embodiment, the same purging conditions previously discussed are used. This results in a second dielectric layer 22, which has one monolayer less than dielectric layer 20.

Figure 3:
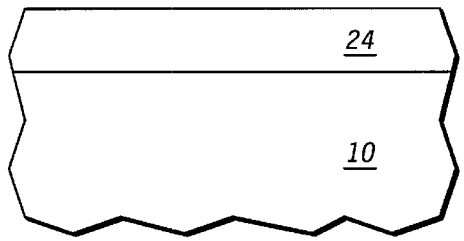

Turning to FIG. 3 a second monolayer of dielectric material 20 is removed. The same processing parameters for removing the first monolayer of dielectric material 20 can be used to remove the second monolayer of dielectric material 20. In addition, any processing parameters that were described for removing the first monolayer can be used for removing the second monolayer. However, the processing steps need not be identical. This results in second dielectric material 24 over substrate 10 having a thickness of approximately 10 Angstroms.

Figure 4:
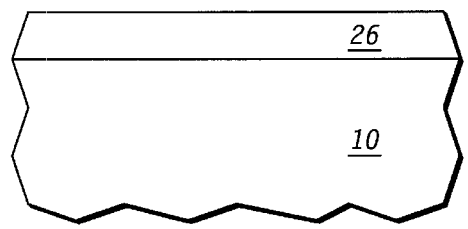

Turning to FIG. 4 a third monolayer of dielectric material 20 is removed. The same processing parameters for removing the first monolayer of dielectric material 20 can be used to remove the third monolayer of dielectric material 20. In addition, any process parameters that were described for removing the first or second monolayer can be used for removing the third monolayer. However, the processing steps need not be identical. This results in third dielectric material 26 over substrate 10 having a thickness of approximately 7 Angstroms or 2 monolayers.

Although layer by layer etching has been described by changing the chemistries for each monolayer and possibly the temperature as well, a different process can be used.

In an alternate embodiment, the layer by layer etching can be performed by flowing a gas that has a higher affinity to bonding with the $SiO_2$ molecules than itself and will form a strong bond with the $SiO_2$ in order to remove the $SiO_2$ molecule during the purge process. Such gases are $CCl_2F_2$ and vapor HF. When using such a gas, introducing a second gas is not necessary. For example, the vapor HF will bond with the $SiO_2$ molecule. Afterwards, the temperature will be increased, but still remain below approximately 200 degrees Celsius. A purge process with parameters of those typically used in ALD is performed thereby removing the vapor HF and $SiO_2$ molecule. This process is repeated for each monolayer that is removed. For example, in the present embodiment, this process will be repeated three times and result in $SiO_2$ material 26 with a thickness of approximately 7 angstroms or 2 monolayers.

Although the present invention has been described with $SiO_2$ material 20 having a thickness of approximately 18 angstroms and removing 11 angstroms through 3 monolayer etches, one of ordinary skill in the art recognizes that a different starting thickness of $SiO_2$ material 20 can be used as well as a different number of monolayers removed.

Figure 5:
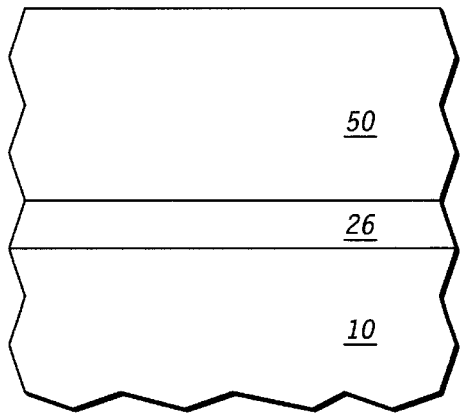
FIG. 5 illustrates a cross sectional view of a portion of a substrate after high K material is formed over the $SiO_2$ dielectric as taught in the present invention.

Turning to FIG. 5, high K material 50 is formed. High K material 50 can consist of hafnium oxide, zirconium oxide, aluminum oxide, combinations thereof and the like. In one embodiment, high K material 50 is deposited by PVD, CVD, combinations thereof and the like. In a preferred embodiment high K material 50 is deposited by ALD. Since the removal of monolayers of $SiO_2$ material 20 is performed using ALE, it is advantageous to use ALD for formation of high K material 50. This allows for the processing of both materials to be performed in the same cluster tool, thus improving cycle time.

Figure 6:
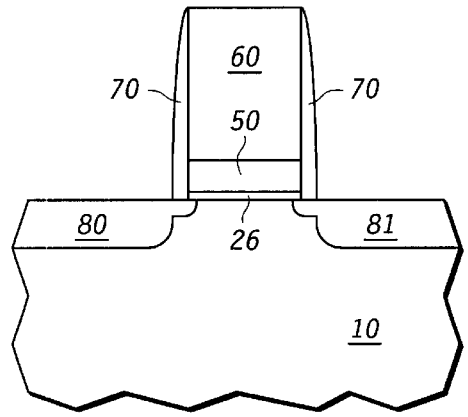
FIG. 6 is a cross sectional view transistor on a portion of a substrate using the present invention.

In FIG. 6 the $SiO_2$ material 26 and high K material 50 are shown incorporated in a transistor. After deposition of high K material 50, traditional CMOS processing continues. Gate material 60 and sidewall spacers 70 are formed. Subsequently, source 80 and drain 81 are formed using traditional ion implantation techniques.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a high dielectric constant gate dielectric on a semiconductor substrate:
    forming a layer of a silicon oxide layer at a high temperature over a semiconductor substrate, wherein the silicon oxide layer comprises a plurality of monolayers of silicon dioxide;
    removing a portion of the plurality of monolayers to leave at least one monolayer; and
    depositing a layer of high dielectric constant material over the at least one monolayer, wherein the high dielectric constant material is not in contact with the semiconductor substrate.

2. The method of claim 1, wherein forming is performed at a temperature greater than about 850 degrees Celsius.

3. The method of claim 2, wherein forming is performed at a first temperature and removing is performed at a second temperature, wherein the second temperature is at least 650 degrees Celsius less than the first temperature.

4. The method of claim 3, wherein the high dielectric constant material comprises a material selected from hafnium oxide, zirconium oxide, zirconium aluminum oxide, and aluminum oxide.

5. The method of claim 4, wherein depositing is performed by atomic layer deposition.

6. The method of claim 5, further comprising placing the semiconductor substrate in a reaction chamber, and wherein removing further comprises:
    introducing a first gas into the reaction chamber;
    purging the reaction chamber of the first gas;
    introducing a second gas into the reaction chamber to cause removing a first monolayer of the plurality of monolayers; and
    repeating introducing the first gas, purging, and introducing the second gas until the portion of monolayers is removed.

7. The method of claim 6, wherein the first gas is $CF_4$, and the second gas is $CHF_3$.

8. The method of claim 6, wherein the first gas is selected from $CF_4$ and $CHF_3$, and the second gas is $O_2$.

9. The method of claim 5, further comprising placing the substrate in a reaction chamber, and wherein removing further comprises:
    introducing a first gas into the reaction chamber;
    purging the reaction chamber of the first gas;
    heating the reaction chamber to cause the removing of a first monolayer of the plurality of monolayers; and
    repeating introducing the first gas, purging, and heating until the portion of monolayers is removed.

10. A method for semiconductor processing, comprising:
    providing a semiconductor substrate having a silicon oxide layer comprising a plurality of monolayers;
    providing a reaction chamber;
    placing the semiconductor substrate into the reaction chamber;

introducing a first gas into the reaction chamber;

purging the reaction chamber of the first gas;

introducing a second gas into the reaction chamber to cause removal of a first monolayer of the plurality of monolayers; and repeating introducing the first gas, purging, and introducing the second gas until a predetermined amount of the silicon oxide layer is removed.

11. The method of claim 10, wherein the first gas is $CF_4$ and the second gas is $CHF_3$.

12. The method of claim 10, wherein the first gas is $CF_4$ and the second gas is $O_2$.

13. The method of claim 10, wherein the first gas is $CHF_3$ and the second gas is $O_2$.

14. A method for semiconductor processing, comprising:

providing a semiconductor substrate having a silicon oxide layer comprising a plurality of monolayers;

providing a reaction chamber;

placing the semiconductor substrate into the reaction chamber;

plurality of monolayers; and repeating introducing the first gas, purging, and heating until a predetermined amount of the silicon dioxide layer is removed.

15. The method of claim 14, wherein the first gas is selected from HF and $CCl_2F_2$.

16. The method of claim 15, wherein the heating is by rapid thermal annealing.

17. A method of forming a transistor, comprising:

providing a semiconductor substrate;

providing a reaction chamber, forming a semiconductor oxide on the substrate, wherein the semiconductor oxide layer comprises a plurality of monolayers;

placing the semiconductor substrate with the semiconductor oxide layer into the reaction chamber;

after inserting the semiconductor substrate into the reaction chamber, introducing a first gas into the reaction chamber;

purging the reaction chamber of the first gas;

after purging the reaction chamber, introducing a second gas into the reaction chamber to cause etching of a first monolayer of the plurality of monolayers;

repeating introducing the first gas, purging, and introducing the second gas until a predetermined amount of the semiconductor oxide layer is removed to leave an interfacial layer of semiconductor oxide layer on the semiconductor substrate;

depositing a layer of high dielectric constant material over the interfacial layer;

forming a gate electrode over the layer of high dielectric constant material; and forming a source and a drain in the semiconductor substrate and adjacent to the gate electrode.

18. The method of claim 17, wherein the semiconductor substrate is silicon and the semiconductor oxide layer is silicon oxide.

19. The method of claim 18, wherein the first gas comprises a gas selected from $CHF_3$ and $CF_4$, and the second gas comprises $O_2$.

20. The method of claim 18, wherein the first gas is $CHF_3$ and the second gas is $CF_4$.

21. The method of claim 18, wherein the silicon oxide is formed at temperature of at least 850 degrees Celsius.

22. The method of claim 18, wherein introducing the first gas, purging, and introducing the second gas are performed at temperatures below 200 degrees Celsius.

23. The method of claim 18, wherein purging is performed by flowing a non-reactive gas over the substrate.

24. A method of forming a transistor, comprising:

providing a semiconductor substrate;

providing a reaction chamber, forming a semiconductor oxide layer on the substrate, wherein the semiconductor oxide layer comprises a plurality of monolayers;

inserting the semiconductor substrate with the semiconductor oxide layer into the reaction chamber;

after inserting the semiconductor substrate into the reaction chamber, introducing a first gas into the reaction chamber;

purging the reaction chamber of the first gas;

after purging the reaction chamber, introducing a second gas into the reaction chamber to cause the etching of a first monolayer of the plurality of monolayers;

repeating introducing the first gas, purging, and introducing the second gas until a desired amount of the semiconductor oxide layer is removed to leave an interfacial layer of semiconductor oxide layer on the semiconductor surface;

depositing a layer of high dielectric constant material over the interfacial layer;

forming a gate electrode over the layer of high dielectric constant material; and forming a source and a drain adjacent in the semiconductor substrate and adjacent to the gate electrode.

25. The method of claim 24, wherein the semiconductor substrate is silicon and the semiconductor oxide layer is silicon oxide.

26. The method of claim 25, wherein the first gas is selected from HF and $CCl_2F_2$.

27. The method of claim 25, wherein the heating is by rapid thermal annealing.

28. The method of claim 25, wherein the silicon oxide layer is formed at temperature of at least 850 degrees Celsius.

29. The method of claim 25, wherein introducing the first gas, purging, and heating the second gas are performed at temperatures below 200 degrees Celsius.

30. The method of claim 25, wherein purging is performed by flowing a non-reactive gas over the substrate.

31. The method of claim 25, wherein the silicon oxide layer is doped.

32. The method of claim 31, wherein the silicon oxide layer is doped with nitrogen.

33. A method for semiconductor processing, comprising:

providing a semiconductor substrate having a silicon oxide layer over the substrate, wherein the silicon oxide layer comprises a plurality of monolayers;

providing a reaction chamber;

inserting the semiconductor substrate into the reaction chamber;

introducing a first gas into the reaction chamber to form a reaction layer on the silicon oxide;

purging the reaction chamber of the first gas;

activating the reaction layer to remove a first monolayer of the plurality of monolayers; and repeating introducing, purging, and activating until a desired portion of the silicon oxide layer has been removed.

34. The method of claim 33 wherein activating comprises introducing a second gas into the chamber.

35. The method of claim 34 further comprising depositing a layer of high dielectric constant material after repeating introducing purging, and activating until a predetermined portion of the silicon oxide layer is removed.

36. The method of claim 33 wherein activating comprises rapid thermal annealing the reaction layer.

37. The method of claim 36 further comprising depositing a layer of high dielectric constant material after repeating introducing purging, and activating until a predetermined portion of the silicon oxide layer is removed.

* * * * *